US008873320B2

(12) United States Patent
Goel et al.

(10) Patent No.: US 8,873,320 B2
(45) Date of Patent: Oct. 28, 2014

(54) DRAM REPAIR ARCHITECTURE FOR WIDE I/O DRAM BASED 2.5D/3D SYSTEM CHIPS

(75) Inventors: Sandeep Kumar Goel, Los Gatos, CA (US); Tze-Chiang Huang, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 220 days.

(21) Appl. No.: 13/489,199

(22) Filed: Jun. 5, 2012

(65) Prior Publication Data
US 2013/0044554 A1 Feb. 21, 2013

Related U.S. Application Data

(60) Provisional application No. 61/524,548, filed on Aug. 17, 2011.

(51) Int. Cl.
*G11C 29/00* (2006.01)
(52) U.S. Cl.
CPC .............. *G11C 29/76* (2013.01); *G11C 29/816* (2013.01); *H01L 2224/16145* (2013.01); *H01L 2924/15192* (2013.01); *H01L 2224/16225* (2013.01); *H01L 2924/15311* (2013.01)
USPC ............... 365/200; 365/51; 365/63; 365/149; 365/150

(58) Field of Classification Search
CPC ................. H01L 2924/10253; H01L 2924/00; H01L 2225/06513; H01L 2225/06541; H01L 2224/16145; H01L 2224/16225; H01L 2924/15192; H01L 2924/15311; G11C 5/02; G11C 29/76; G11C 29/816
USPC ............................... 365/200, 51, 63, 149, 150
See application file for complete search history.

(56) References Cited

U.S. PATENT DOCUMENTS

| 7,894,229 | B2 * | 2/2011 | Lahtinen et al. | ................. 365/51 |
| 8,110,899 | B2 * | 2/2012 | Reed et al. | ..................... 257/621 |
| 8,110,910 | B2 * | 2/2012 | Kim | .............................. 257/686 |
| 8,421,245 | B2 * | 4/2013 | Gonzalez et al. | ............. 257/777 |

* cited by examiner

Primary Examiner — Pho M Luu
(74) Attorney, Agent, or Firm — Duane Morris LLP

(57) ABSTRACT

A 2.5D or 3D repair architecture includes a logic die, and a memory die. In the 2.5D architecture, the logic die and memory die are mounted on an interposer. In the 3D architecture, the memory die is mounted on the logic die. The logic has a control logic wrapped with a processor wrapper. The processor wrapper enables testing components of the control logic. The control logic further comprises a wide input/output controller, a built-in-repair analyzer (BIRA), and a repair controller. A method utilizing the repair architecture provides for repairing failed columns and rows of a memory device.

20 Claims, 6 Drawing Sheets

DRAM REPAIR ARCHITECTURE FOR WIDE I/O DRAM BASED 2.5D/3D SYSTEM CHIPS

This application claims priority to U.S. Provisional Patent Application No. 61/524,548, entitled DRAM REPAIR ARCHITECTURE AND METHOD FOR WIDE IO DRAM BASED 2.5D/3D SYSTEM CHIPS, filed Aug. 17, 2011.

BACKGROUND

1. Technical Field

Aspects of the present disclosure relate in general to electronic circuitry. In particular, aspects of the disclosure include a repair process and architecture for Dynamic Random Access Memory (DRAM) in 2.5D/3D System Chips.

2. Description of the Related Art

With conventional two-dimensional (2D) computer chips, a processor and random access memory (RAM) are located on the same plane, and connected via a package substrate.

However, as the electronics industry evolves, chips are now taking advantage of the third dimension—wide input/output dynamic random access memory coupled on top of a processor (3D) or next to a processor via an interposer (2.5D). In such instances, the placement in the third dimension reduces interconnect capacitance between the two components.

SUMMARY

In one embodiment, an apparatus includes a wide input/output controller, a built-in-repair analyzer (BIRA), and a repair controller. The wide input/output controller communicates with a dynamic random access memory (DRAM) channel via a physical layer. The built-in-repair analyzer collects communications failure data from the wide input/output controller and analyzes the failure data to determine failed columns and rows of dynamic random access memory in the dynamic random access memory channel. The repair controller generates commands to repair the failed columns and rows of dynamic random access memory.

In another embodiment, the logic die and memory die are mounted on an interposer. A memory die includes a dynamic random access memory channel. The logic has a control logic wrapped with a processor wrapper. The processor wrapper enables testing components of the control logic. The control logic further comprises a wide input/output controller, a built-in-repair analyzer, and a repair controller. The wide input/output controller communicates with the dynamic random access memory channel via a physical layer. The built-in-repair analyzer collects communication failure data from the wide input/output controller and analyzes the failure data to determine failed columns and rows of dynamic random access memory in the dynamic random access memory channel. The repair controller generates commands to repair the failed columns and rows of dynamic random access memory.

In yet another embodiment, a memory die is mounted on a logic die. A memory die has a dynamic random access memory channel. The logic has a control logic wrapped with a processor wrapper. The processor wrapper enables testing components of the control logic. The control logic further comprises a wide input/output controller, a built-in-repair analyzer, and a repair controller. The wide input/output controller communicates with the dynamic random access memory channel via a physical layer. The built-in-repair analyzer collects communication failure data from the wide input/output controller and analyzes the failure data to determine failed columns and rows of dynamic random access memory in the dynamic random access memory channel. The repair controller generates commands to repair the failed columns and rows of dynamic random access memory.

In yet another embodiment a method is provided. The method collects and analyzes communications failure data and generates commands to repair failed columns and rows of a dynamic random access memory. The method comprises: communicating with a dynamic random access memory (DRAM) channel via a physical layer using a wide input/output controller; collecting communication failure data from the wide input/output controller using a built-in-repair analyzer (BIRA); analyzing the communication failure data to determine failed columns and rows of dynamic random access memory in the dynamic random access memory channel using the built-in-repair analyzer (BIRA); and generating repair commands to repair the failed columns and rows of the dynamic random access memory.

DETAILED DESCRIPTION

Figure 1:
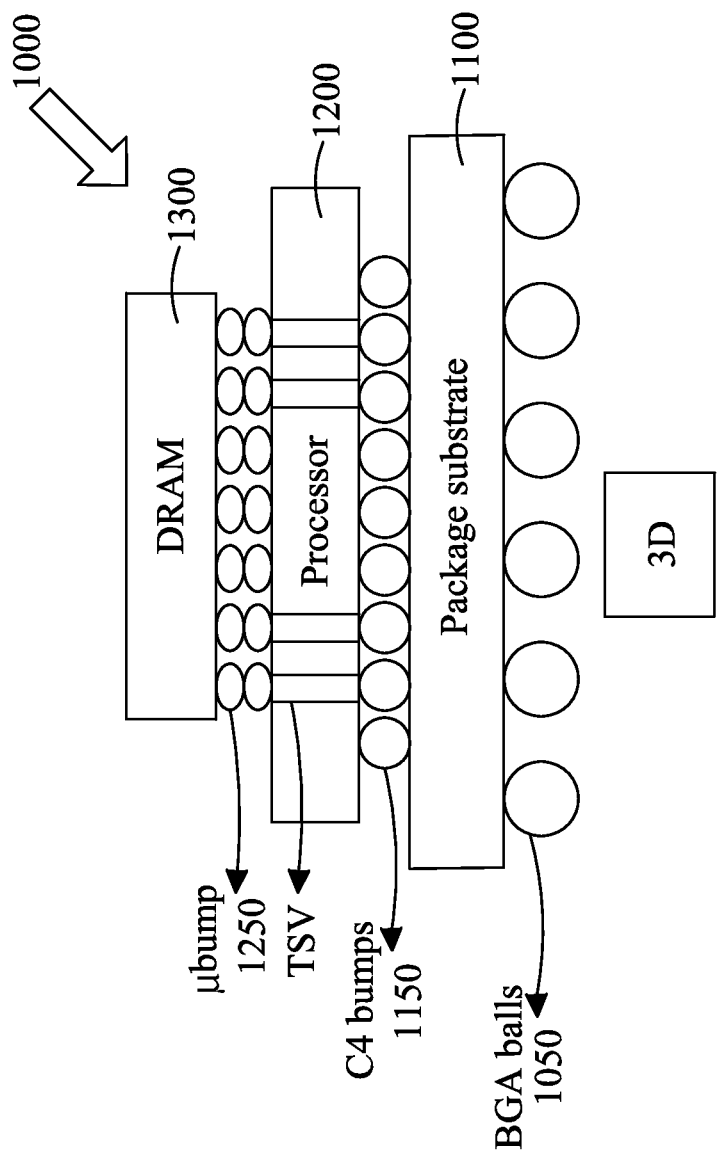
FIG. 1 depicts a 3D system embodiment.

One aspect of the present disclosure includes a repair architecture for stacked dies. Stacked dies includes Wide Input/Output dynamic random access memory and other logic dies. Such a repair architecture enables individual die repairs, and interconnect repairs between dies. Some embodiments of the repair architecture are compliant with the Institute of Electrical and Electronics Engineers (IEEE) 1149.1 Standard Test Access Port and Boundary-Scan Architecture for board-level integration of 2.5D/3D dies. An industry standard name for IEEE 1149.1 is Joint Test Action Group (JTAG).

Embodiments minimize area overhead while reusing system on a chip ("SOC") repair infrastructure and repair patterns. Yet other embodiments interface with wide I/O DRAM boundary scan control and register with no test access port (TAP) controller.

The following embodiments are described in a plurality of sections. Further, circuit elements making up each of functional blocks of the following embodiments are formed on a semiconductor substrate made of a single crystal silicon by use of the known integrated circuit (IC) technology for Complementary Metal Oxide Semiconductors (CMOS) transistors.

Embodiments of the disclosure will be described hereinafter with reference to the drawings. In all the drawings for use describing the embodiments, identical members are in principle denoted by like reference numerals, thereby omitting detailed description thereof.

Let us now turn to an embodiment of a 3D chip system 1000, shown in FIG. 1, constructed and operative in accordance with an embodiment of the current disclosure. A 3D chip system is one in which components are connected in three dimensions: length, width, and height. As shown in FIG. 1, in a 3D chip system 1000, a wide I/O DRAM 1300 are stacked on top of a processor 1200 via microbumps 1250. Processor 1200 is similarly stacked on a package substrate 1100 via C4 bumps (solder bumps) 1150. The package substrate 1100 is surface-mounted using a ball gate array (BGA) 1050. As is discussed below, repair embodiments of the present disclosure can be used in a 3D chip system 1000.

Figure 2:
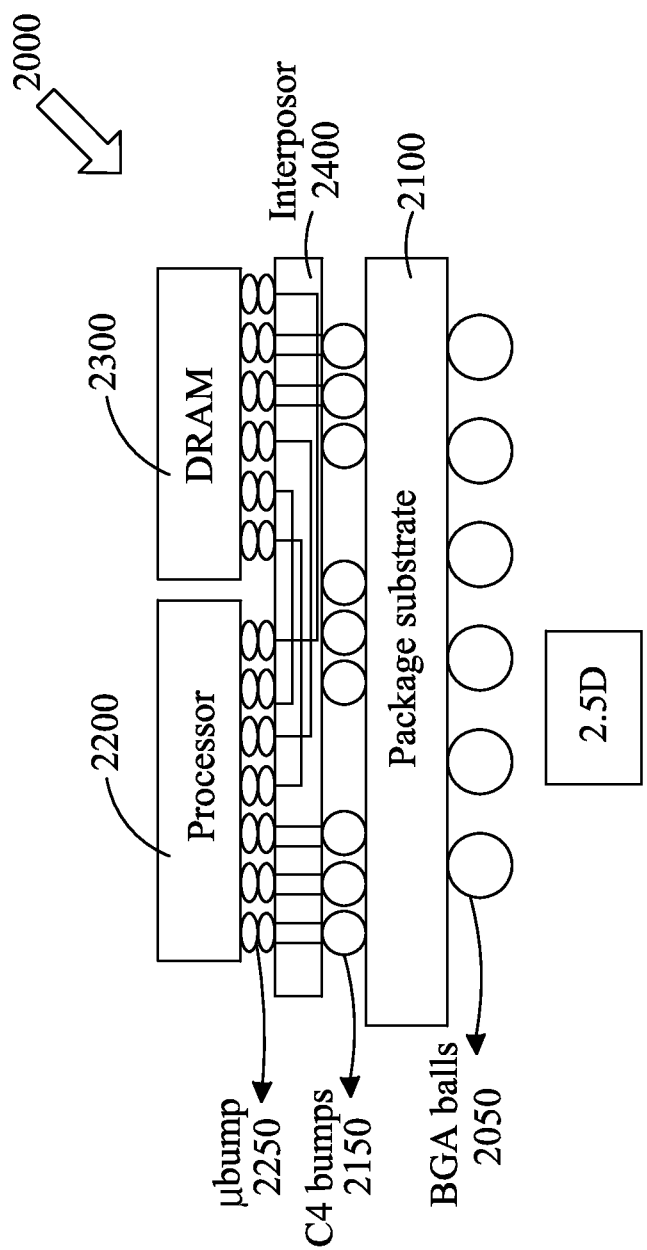
FIG. 2 illustrates 2.5D system embodiment.

Similarly, repair embodiments can be used in conjunction with a 2.5D chip system 2000, shown in FIG. 2, constructed and operative in accordance with an embodiment of the current disclosure. A 2.5D chip system 2000 is one in which components, such as processor 2200 and dynamic random access memory 2300 are coupled to a package substrate 2100 in three dimensions via an interposer 2400. As shown in FIG. 2, components processor 2200 and DRAM 2300 are stacked on top of a interposer 2400 via microbumps 2250. Interposer 2400 is similarly stacked on package substrate 2100 via C4 bumps 2150. The package substrate 2100 is surface mounted using ball gate array 2050. As is discussed below, repair embodiments of the present disclosure can be used in a 2.5D chip system 2000.

Figure 3:
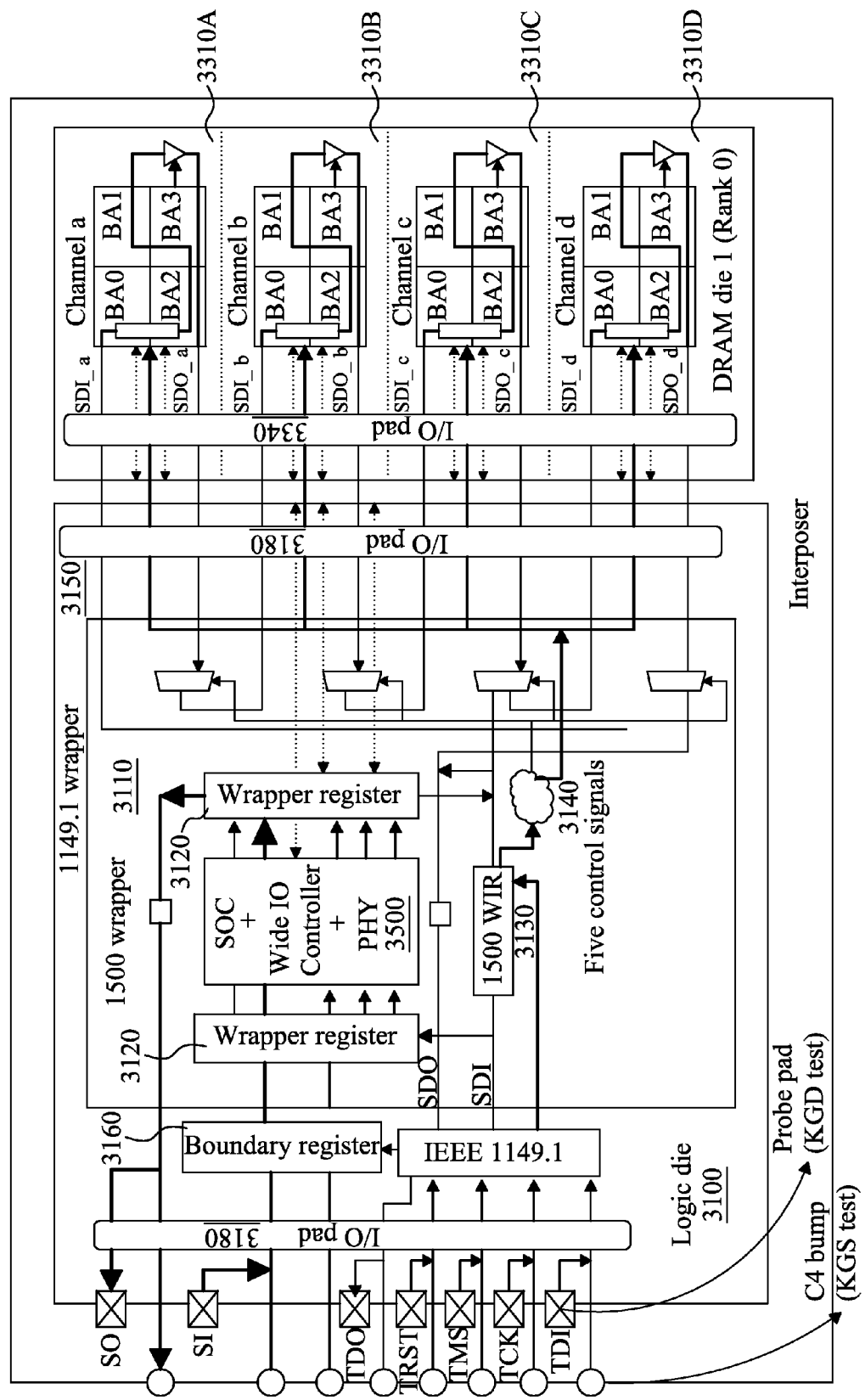
FIG. 3 elaborates on an implementation of a repair architecture for a single wide input/output DRAM die.

FIG. 3 illustrates a repair (DFT) architecture for a single wide input/output DRAM channel, constructed and operative in accordance with an embodiment of the current disclosure. In this 2.5D embodiment, a logic die 3200 and a dynamic random access memory die 3300 are mounted on interposer 3400. It is understood by those practiced in the art that the principles described herein may also apply to a 3D embodiment.

In this embodiment, logic die 3200 comprises a processor 3500 wrapped with a processor wrapper 3110. Processor wrapper 3110 is an Institute of Electrical and Electronics Engineers (IEEE) Std. 1500 wrapper. The processor wrapper 3110 can also wrap at least one wrapper register 3120A-B, a Wrapper Instruction Register (WIR) 3130 and logic to data adapter 3140.

Processor 3500 includes a System on a Chip (SOC), a Wide Input/Output Controller and physical layer (PHY). Processor 3500 is described in greater detail in FIG. 5.

Processor wrapper 3110 enables repair reuse and integration for embedded cores and associated circuitry. Processor wrapper 3110 foregoes addressing analog circuits and focuses on facilitating efficient repair of digital aspects of systems on chip. Furthermore, processor wrapper 3110 has serial and parallel test access mechanisms (TAMs) and a rich set of instructions suitable for repairing cores, System on a Chip interconnect, and circuitry. In addition, processor wrapper 3110 includes features that enable core isolation and protection.

Figure 4:
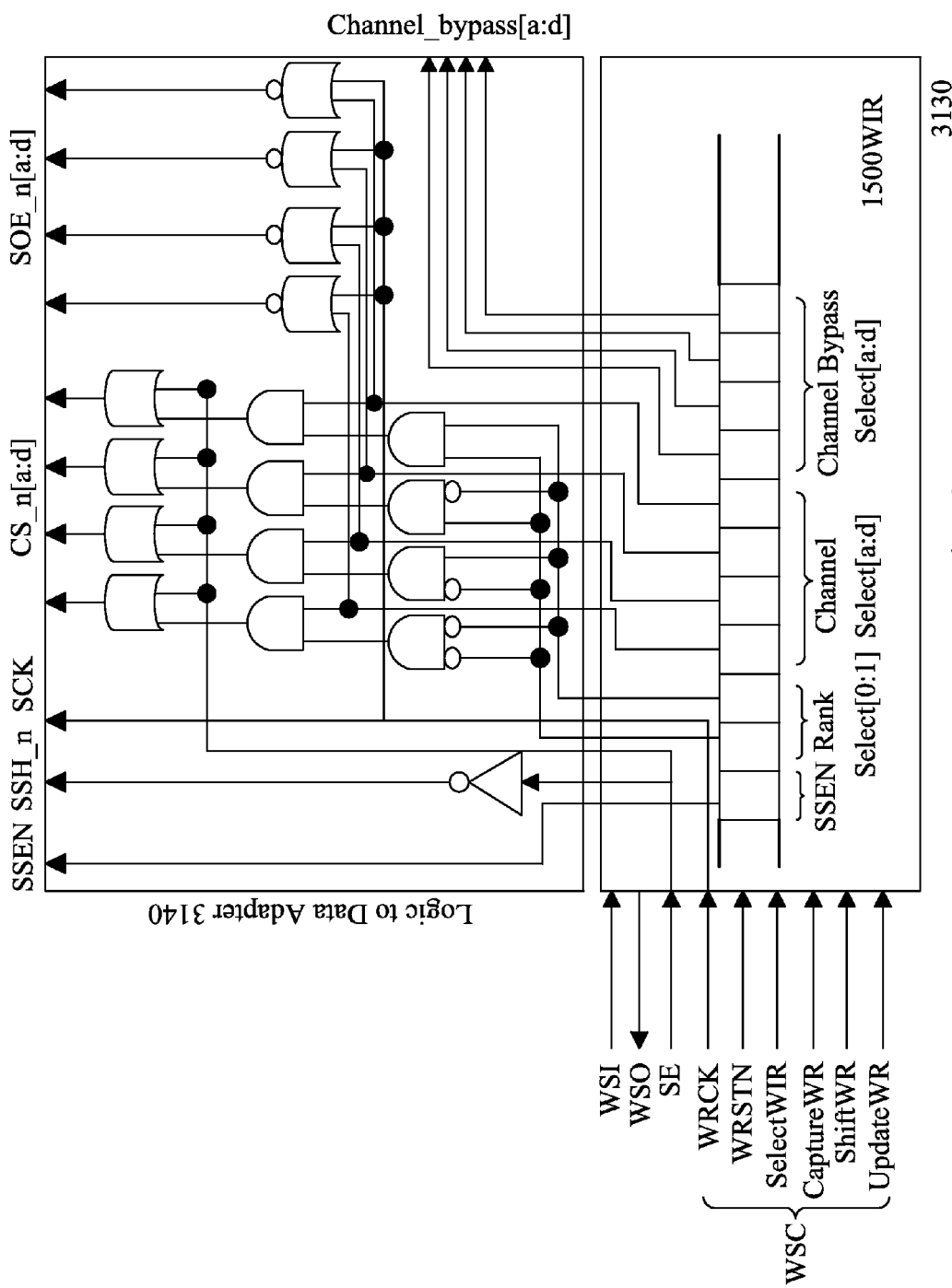
FIG. 4 is a block diagram of logic to data adapter and Wrapper Instruction Register as part of a repair architecture for a wide input/output DRAM die.

In some embodiments, Wrapper Instruction Register 3130 is a IEEE 1500 Wrapper Instruction Register. FIG. 4 depicts an implementation of Wrapper Instruction Register 3130 and logic to data adapter 3140, constructed and operative in accordance with an embodiment of the current disclosure.

Returning to FIG. 3, logic die 3200 further comprises a boundary scan wrapper 3150. In some embodiments, boundary scan wrapper 3150 is an IEEE Std. 1149.1 wrapper architecture and access mechanism designed to enable repairing components of a board. Boundary scan wrapper 3150 wraps processor wrapper 3110, a boundary register 3160, a boundary scan wrapper instruction register 3170, and any input/output pads 3180. Boundary scan wrapper instruction register 3170 is an IEEE 1149.1 wrapper instruction register.

Channel selection/bypass logic 3330 and boundary scan registers 3320 is controlled by the control-logic 3200 on logic/processor die 3200.

Control logic 3200 is controlled by the Wrapper Instruction Register 3130 or directly by the top-level boundary scan wrapper instruction register 3170.

It is understood by those practiced in the art that logic die pins connected to interposer 3100 or a substrate with boundary scan logic.

Logic test pins (not shown) are connected to probe pads for Known Good Die (KGD) repairing and C4 bumps for FT/KGS repairing.

Dynamic Random Access memory die 3300 comprises dynamic random access memory 3310, DRAM boundary scan registers 3320, DRAM channel selection/bypass logic 3330, and input/output pads 3340. DRAM channel selection/bypass logic 3330 performs as the interface between the logic die 3200 and the DRAM die 3300. It is further understood that an individual channel can be selected for interconnect repair between logic die 3200 and DRAM die 3300.

Dynamic Random Access Memory die 3300 has four Dynamic Random Access Memory channels per die 3310A-D, and four banks in each channel. Each channel 3310 has separate boundary scan signals, and only a SSEN signal (global scan enable) is shared among all channels. Furthermore, DRAM die 3300 may also comprise input/output pads 3340.

Figure 5:
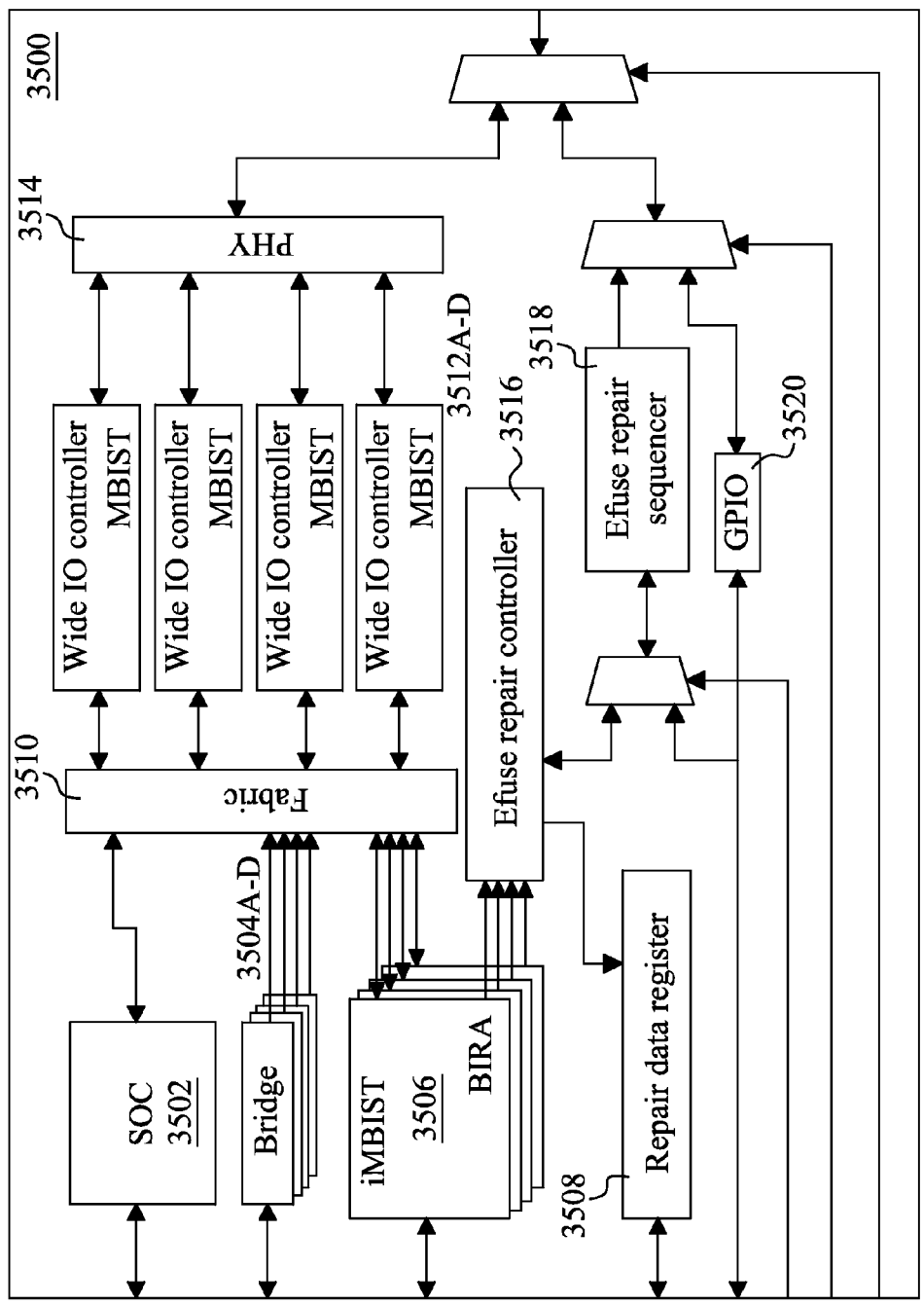
FIG. 5 illustrates an implementation of a processor as part of a repair architecture for wide input/output stacked DRAM dies.

FIG. 5 illustrates on an implementation of a processor 3500 as part of a repair architecture for wide input/output stacked DRAM dies, constructed and operative in accordance with an embodiment of the current disclosure. It is understood by those practiced in the art that the principles described herein apply to 2.5D and 3D embodiments.

As discussed above, processor 3500 includes a System on a Chip 3502, a Wide Input/Output Controller 3512 for each dynamic random access memory channel 3310 and physical layer (PHY) 3514. As shown in FIG. 5, processor 3500 may further include interconnect fabric 3510, an on-chip built-in-repair analyzer (BIRA) 3506, a repair controller 3516, a repair data register 3508, an eFUSE repair sequencer 3518, and generic purpose input/output (GPIO) pins 3520. The use of these components are described below.

Using the wide input/output controllers 3512A-D, the on-chip built-in-repair-analyzer 3606 enables collection of fail data for each dynamic random access memory channel 3310A-D. In some embodiments, wide I/O controller 3512 has memory built-in self-test (MBIST) capabilities.

Some embodiments have more than one on-chip built-in-repair-analyzer 3606. Yet other embodiments have built-in-repair-analyzers 3506A-D for each wide input/output controller 3512A-D.

The repair controller 3516 is an eFUSE repair controller. The eFUSE repair controller 3516 allows for the dynamic real-time reprogramming of computer chips. By utilizing eFUSE repair controller 3516, a repair data register 3508, and repair sequencer 3518, circuits on a chip can change while it is in operation. In some embodiments, repair sequencer 3518 is an eFUSE repair sequencer.

Additionally, built-in-repair-analyzer 3606 can read and repair row/column information and generate corresponding commands from ATE. The eFUSE repair sequencer 3518 sends commands to the dynamic random access memory die via configured generic purpose input/output pins 3520.

The repair architect embodiments described above are therefore independent of any particular circuit implementation, and any command may be generated for repair.

Figure 6:
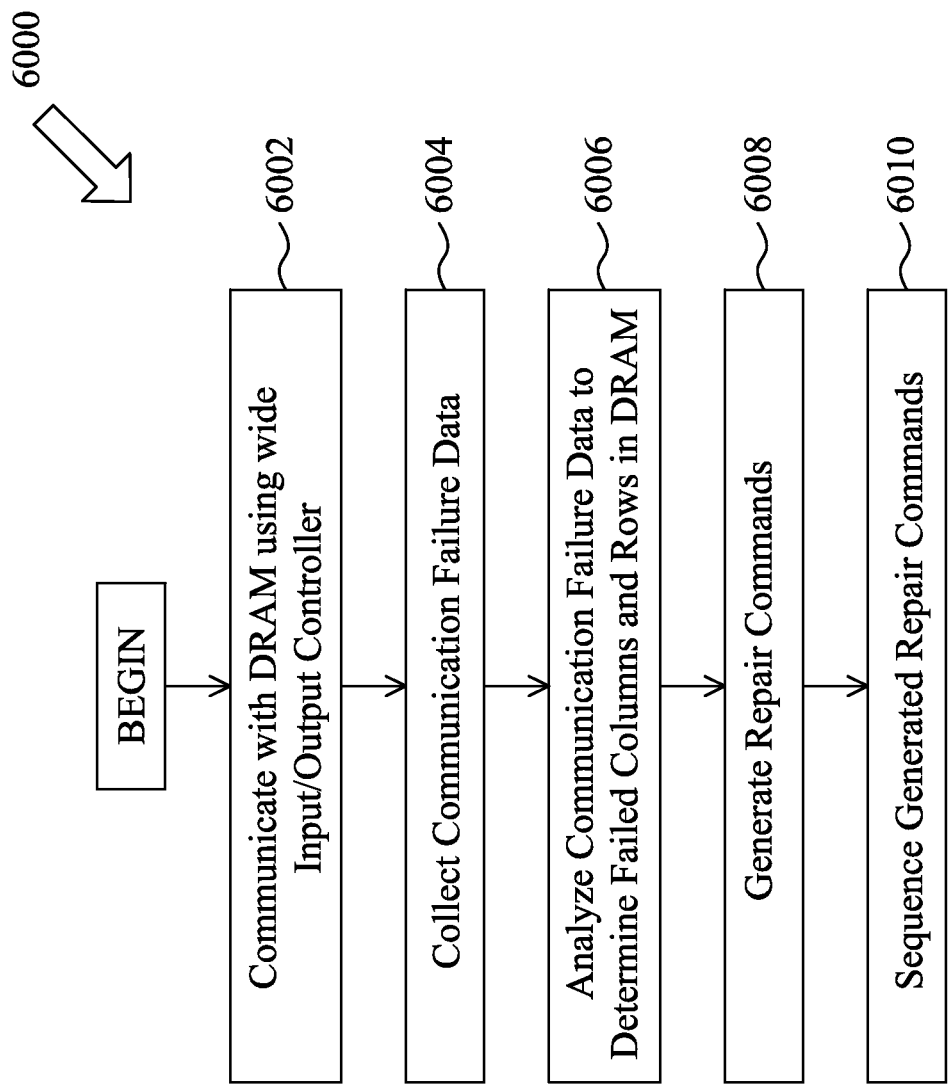
FIG. 6 illustrates a method for collecting and analyzing communication failure data and generating repair commands.

FIG. 6 illustrates a method 6000 utilizing the repair architecture described herein. At block 6002, method 6000 provides for communicating with a dynamic random access memory (DRAM) channel via a physical layer, using a wide input/output controller. The DRAM channel may be in a memory chip disposed on an interposer disposed on a package substrate in some embodiments. Method 6000 may be carried out using the various repair architecture embodiments described herein. At block 6004, method 6000 provides for collecting communication failure data from the wide input/output controller using a built-in-repair analyzer (BIRA). At block 6006, method 6000 provides for analyzing the communication failure data to determine failed columns and rows of dynamic random access memory in the DRAM channel. The analyzing at block 6006 may be carried out using the BIRA. At block 6008, method 6000 provides for generating repair commands to repair the failed columns and rows of the dynamic random access memory. The step of generating repair commands is carried out using a repair controller in some embodiments. At block 6010, method 6000 provides for sequencing the generated repair commands. The sequencing at block 6010 is carried out using a repair sequencer in some embodiments. The repair controller is an eFUSE repair controller in some embodiments and the repair sequencer is an eFUSE repair sequencer in some embodiments. In some embodiments, method 6000 also includes using a generic purpose input/output (GPIO) for receiving repair instructions from the repair controller.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

What is claimed is:

1. An apparatus comprising:
   a wide input/output controller configured to communicate with a dynamic random access memory (DRAM) channel via a physical layer;
   a built-in-repair analyzer (BIRA) configured to collect communication failure data from the wide input/output controller and further configured to analyze the failure data to determine failed columns and rows of dynamic random access memory in the DRAM channel;
   a repair controller configured to generate commands to repair the failed columns and rows of dynamic random access memory.

2. The apparatus of claim 1 further comprising:
   a repair sequencer to sequence the generated repair commands.

3. The apparatus of claim 2 further comprising:
   generic purpose input/output (GPIO) pins configured to receive repair instructions from the repair controller.

4. The apparatus of claim 3, wherein the repair controller is an eFUSE repair controller and the repair sequencer is an eFUSE repair sequencer.

5. The apparatus of claim 4, further comprising:
   a control logic configured as a system on a chip.

6. A apparatus comprising:
   a memory die including a dynamic random access memory (DRAM) channel;
   a logic die including a control logic wrapped with a processor wrapper, the processor wrapper being configured to enable testing components of the control logic; the control logic further comprising:
   a wide input/output controller configured to communicate with the dynamic random access memory channel via a physical layer;
   a built-in-repair analyzer (BIRA) configured to collect communication failure data from the wide input/output controller and further configured to analyze the failure data to determine failed columns and rows of dynamic random access memory in the dynamic random access memory channel;
   a repair controller configured to generate commands to repair the failed columns and rows of dynamic random access memory.

7. The apparatus of claim 6 further comprising:
   a repair sequencer to sequence the generated repair commands.

8. The apparatus of claim 7 further comprising:
   generic purpose input/output (GPIO) pins configured to receive repair instructions from the repair controller.

9. The apparatus of claim 7, wherein the repair controller is an eFUSE repair controller and the repair sequencer is an eFUSE repair sequencer.

10. The apparatus of claim 6 further comprising an interposer and a package substrate and wherein the memory die is mounted on the interposer disposed on the package substrate.

11. The apparatus of claim 10 wherein the logic die is further mounted on the interposer.

12. The apparatus of claim 6 wherein the memory die is mounted upon the logic die.

13. The apparatus of claim 12 further comprising a package substrate and wherein the logic die is mounted upon the package substrate.

14. The apparatus of claim 6, wherein the control logic is a system on a chip and the logic die further comprises:
   a boundary scan wrapper configured to wrap the processor wrapper, the boundary scan wrapper being configured to enable testing components of a board, wherein the processor wrapper is an Institute of Electrical and Electronics Engineers (IEEE) Std. 1500 wrapper and the boundary scan wrapper is an Institute of Electrical and Electronics Engineers Std. 1149.1 wrapper.

15. A method comprising:
   communicating with a dynamic random access memory (DRAM) channel via a physical layer, using a wide input/output controller;
   collecting communication failure data from the wide input/output controller using a built-in-repair analyzer (BIRA);
   analyzing the communication failure data to determine failed columns and rows of dynamic random access memory in the DRAM channel using the built-in-repair analyzer (BIRA); and
   generating repair commands to repair the failed columns and rows of the dynamic random access memory.

16. The method of claim 15 wherein the generating repair commands is carried out using a repair controller.

17. The method of claim 16 further comprising sequencing the generated repair commands using a repair sequencer.

18. The method of claim 17 further comprising: receiving repair instructions from the repair controller using generic purpose input/output (GPIO) pins.

19. The method of claim 18, wherein the repair controller is an eFUSE repair controller and the repair sequencer is an eFUSE repair sequencer.

20. The method of claim 15 wherein the DRAM channel is disposed in a memory chip disposed on an interposer.

* * * * *